United States Patent
Darwhekar et al.

(10) Patent No.: US 10,236,826 B1
(45) Date of Patent: Mar. 19, 2019

(54) LOW POWER HIGH DYNAMIC RANGE ACTIVE MIXER BASED MICROWAVE DOWNCONVERTER WITH HIGH ISOLATION

(71) Applicant: TEXAS INSTRUMENTS INCORPORATED, Dallas, TX (US)

(72) Inventors: Yogesh Darwhekar, Bengaluru (IN); Apoorva Bhatia, Lucknow (IN); Subhashish Mukherjee, Bengaluru (IN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 16/000,972

(22) Filed: Jun. 6, 2018

(51) Int. Cl.
*H04B 1/26* (2006.01)
*H03B 5/18* (2006.01)
*H04B 1/16* (2006.01)
*H04B 1/04* (2006.01)
*H03D 7/14* (2006.01)

(52) U.S. Cl.
CPC .......... *H03B 5/1876* (2013.01); *H03B 5/1852* (2013.01); *H03D 7/1433* (2013.01); *H04B 1/04* (2013.01); *H04B 1/16* (2013.01)

(58) Field of Classification Search
CPC ...... H03B 5/1876; H03B 5/1852; H04B 1/16; H04B 1/04; H03D 7/1433
USPC ...................................................... 455/318
See application file for complete search history.

(56) References Cited

U.S. PATENT DOCUMENTS

| 4,636,663 | A | * | 1/1987 | Jongepier | H03D 7/1425 327/113 |
|---|---|---|---|---|---|
| 6,529,721 | B1 | * | 3/2003 | Tiller | H03D 7/1425 455/323 |
| 2009/0221259 | A1 | * | 9/2009 | Shiramizu | H03D 7/1433 455/334 |
| 2012/0049972 | A1 | * | 3/2012 | Ginsburg | H01P 5/184 333/103 |
| 2015/0137869 | A1 | * | 5/2015 | Akizuki | H03D 7/1441 327/359 |

* cited by examiner

*Primary Examiner* — Sanh D Phu
(74) *Attorney, Agent, or Firm* — John R. Pessetto; Charles A. Brill; Frank D. Cimino

(57) ABSTRACT

A down converter, including first and second biasing circuits, mixer, and transformer coupled to receive amplifier output signal. The first and second biasing circuits each include a biasing transistor and a first and second node, respectively. Mixer includes first and second transistors coupled to first node and third and fourth transistors coupled to second node. The second and fourth transistors are coupled to a third node. The first and third transistors are coupled to a fourth node. Mixer also includes a first resistor coupled to the fourth node and a supply voltage node and a second resistor coupled to the third node and a supply voltage node. Transformer includes a primary winding coupled to receive the amplifier output signal and to a supply voltage and a secondary winding coupled to mixer and first biasing circuit at first node and coupled to mixer and second biasing circuit at second node.

20 Claims, 5 Drawing Sheets

US 10,236,826 B1

LOW POWER HIGH DYNAMIC RANGE ACTIVE MIXER BASED MICROWAVE DOWNCONVERTER WITH HIGH ISOLATION

BACKGROUND

Radio frequency down converters often suffer from low dynamic range, high power consumption, and poor local oscillator port to radio frequency port isolation. Current commutating Gilbert cell mixers provide excellent switching speed with low amplitude local oscillator signal to drive which make them attractive for microwave or millimeter wave operation. However, these mixers are noisy and thus are accompanied with low noise amplifiers (LNA) to keep the overall noise within system budget. Traditional solutions struggle to achieve good dynamic range, characterized by the Input-referred Third-Order Intercept Point minus noise figure (IIP3-NF), while maintaining lower power consumption and local oscillator (LO) port to radio frequency (RF) port isolation.

SUMMARY

In some examples, a down converter includes an amplifier, a mixer, a first biasing circuit, a second biasing circuit, and a transformer. The amplifier is configured to receive a radio frequency input. The transformer includes a primary winding and a secondary winding. The primary winding is coupled to receive the amplifier output signal and to a supply voltage. The secondary winding is coupled to the mixer and the first biasing circuit at a first node and coupled to the mixer and the second biasing circuit at a second node. The first biasing circuit includes a first biasing transistor and a first node configured to be coupled to the mixer. In some examples, the first biasing circuit also includes a first filter. The second biasing circuit includes a second biasing transistor and a second node configured to be coupled to the mixer. In some examples, the second biasing circuit also includes a second filter. The mixer includes a first transistor and a second transistor coupled to the first biasing circuit at the first node, a third transistor and a fourth transistor coupled to the second biasing circuit at the second node, and a first resistor and a second resistor. The second transistor and the fourth transistor are coupled to a third node. The first and third transistors are coupled to a fourth node. The first resistor is coupled to the fourth node and a supply voltage node and the second resistor is coupled to the third node and the supply voltage node.

BRIEF DESCRIPTION OF THE DRAWINGS

For a detailed description of various examples, reference will now be made to the accompanying drawings in which.

DETAILED DESCRIPTION

Described herein is an example of an active mixer-based microwave down converter. The down converter in the disclosed examples includes a mixer, a low noise amplifier (LNA), a transformer, and two biasing circuits. The disclosed mixer is a derivative of a Gilbert cell mixer and acts as the active mixer. The disclosed mixer is magnetically coupled to the LNA by the transformer. Each biasing circuit includes a transistor biased to operate in the saturation region as a current source and a filter to reduce the noise of the transistor acting as a current source. Some downconverters include an isolation transformer where the secondary winding couples to the gates of the input transistors feeding into the mixer's switching core. However, in the disclosed examples, the isolation transformer is instead coupled such that the secondary winding couples to the emitters of the switching port transistors of the mixer.

The placement of the transformer in the disclosed down converter allows for improved biasing for the mixer and isolates the LNA and the mixer domain signal currents. The noise of each tail current source, the biasing transistors, is attenuated through a low pass filter without compromising the signal bandwidth. Current gain from an inter-stage transformer improves the signal to noise ratio (SNR) of the input signal to be mixed with an associated input signal from an oscillator. As a result, the disclosed down converter provides for a relatively high dynamic range while achieving a relatively low power consumption, and also provides for improved isolation between the LNA and the mixer.

Figure 1:
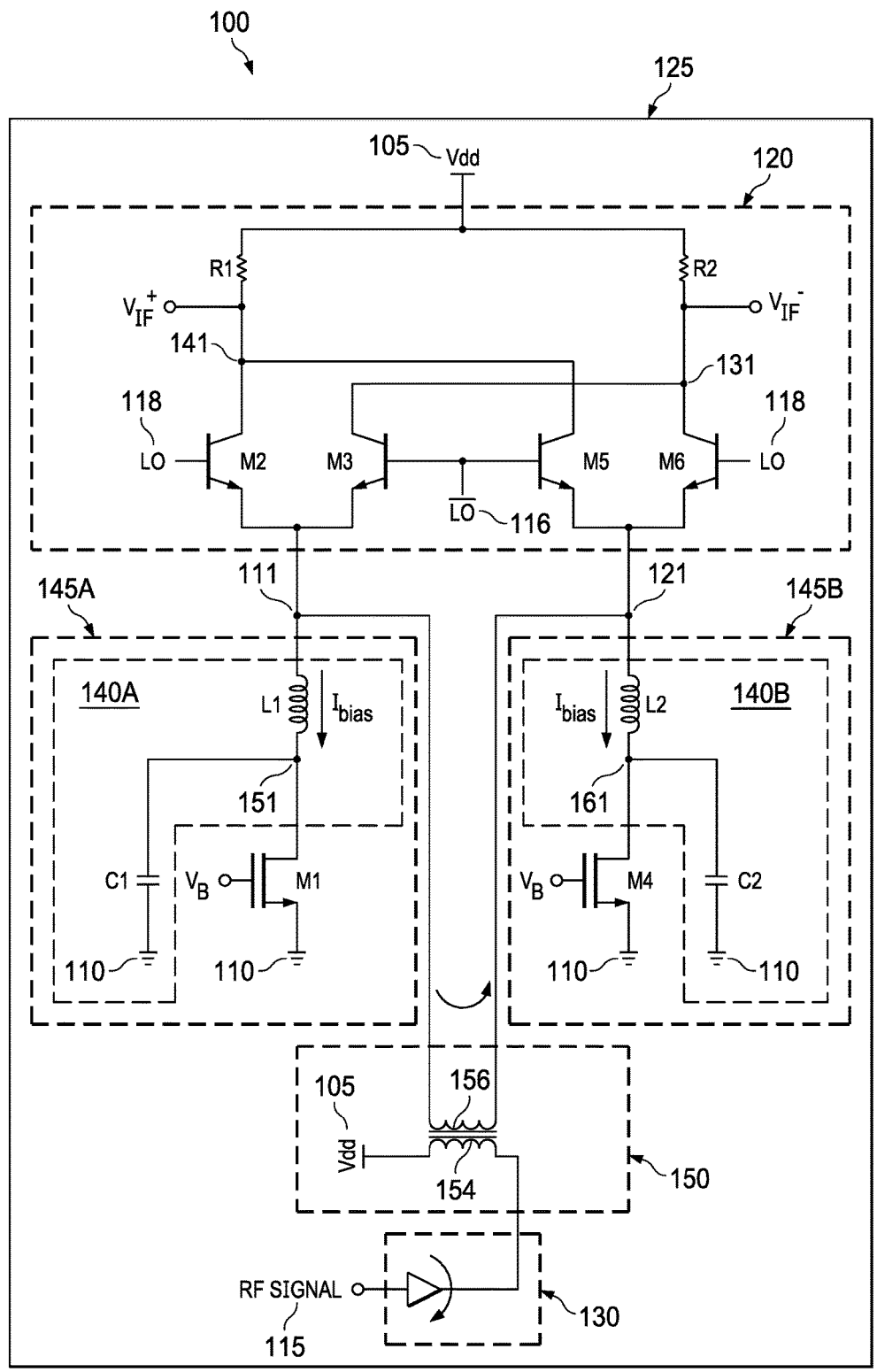
FIG. 1 illustrates an example active mixer-based microwave down converter according to one embodiment.

FIG. 1 illustrates an example of an active mixer-based microwave down converter 100 that down converts a radio frequency (RF) signal 115. In this example, the down converter 100 includes a mixer 120 as the active mixer. The disclosed mixer 120 is magnetically coupled to a low noise amplifier (LNA) 130 through a transformer 150 and includes transistors M2, M3, M5, and M6 as well as resistors R1 and R2. The down converter 100 also includes two biasing circuits, 145A and 145B. The first biasing circuit 145A includes M1 coupled to filter 140A. The second biasing circuit 145B includes M4 and filter 140B. Transistors M1 and M4 act as biasing transistors and operate in the saturation region to serve as current sources. Filters 140A and 140B attenuate noise from the tail current sources M1 and M4. In some implementations, the biasing circuits 145A and 145B introduce relatively little noise to the down converter 100. The LNA 130 amplifies the RF signal 115. The mixer 120 mixes or multiplies the output of the LNA 130 with an oscillator signal (e.g., local oscillator (LO) signal 118).

As noted above, LNA 130 receives the radio frequency input signal 115. Transformer 150 magnetically couples LNA 130 to mixer 120 and amplifies the current from the LNA 130 according to the number of windings in the primary winding 154 compared to the number of windings in the secondary winding 156. Magnetic coupling through transformer 150 isolates the LNA 130 from the mixer 120 and provides independent current paths through each of the LNA 130 and the mixer 120. This isolation reduces LO coupling through the system. Transformer 150 is powered by supply voltage VDD provided on supply voltage node 105. In some examples, transformer 150 is a balun: a type of transformer used to join a balanced line with two conductors and equal currents in opposite directions to an unbalanced line with a single conductor and a ground.

One terminal of the secondary winding 156 of transformer 150 is connected to the inductor L1 of filter 140A of biasing circuit 145A and to emitters of M2 and M3 from mixer 120 at node 111 as shown. Similarly, the other terminal of the secondary winding 156 is connected to inductor L2 of filter 140B of biasing circuit 145B and to the emitters of M5 and M6 from mixer 120 at node 121. Transistors M2, M3, M5, and M6 in the example of FIG. 1 comprise bipolar junction transistors (BJTs). Each transistor includes a control input (base) and a pair of current terminals (collector and emitter). In other examples, the transistors M2, M3, M5 and M6 are implemented as n-type metal oxide semiconductor field effect transistors (NMOS) or p-type metal oxide semiconductor field effect transistors (PMOS). As a field effect transistor, the control input is a gate terminal and the current terminals are source and drain terminals.

As discussed previously, transistors M1 and M4 from biasing circuits 145A and 145B act as biasing transistors and operate in the saturation region to serve as tail current sources. In this example, transistors M1 and M4 comprise NMOS transistors and include a control input and a pair of current terminals. As a field effect transistor, the control input includes a gate terminal and the current terminals comprise source and drain terminals. In other examples, transistors M1 and M4 can be implemented as bipolar junction transistors (BJTs) and, in those examples, the control input comprises a base terminal and the current terminals comprise emitter and collector terminals. The source terminals of M1 and M4 are connected to ground node 110 and the gates of M1 and M4 are connected to a bias voltage Vb. Bias voltage Vb is chosen such that transistors M1 and M4 operate in the saturation region. The drain terminals of biasing transistors M1 and M4 are connected to filters 140A and 140B, respectively.

As discussed previously, filters 140A and 140B reduce the noise of tail bias current. In this example, filters 140A and 140B include inductors and capacitors. Filter 140A includes inductor L1 and capacitor C1. Filter 140B includes inductor L2 and capacitor C2. In other examples, filters 140A and 140B include resistors and capacitors. The architecture of the filters and value of the filters' components cause the filters to implement frequency responses that reduce noise without affecting the radio frequency input signal 115. Inductor L1 and capacitor C1 are connected together and to the drain of M1. Capacitor C1 is connected to ground node 110. Inductor L2 and capacitor C2 are connected together and to the drain of M4. Capacitor C2 is connected to ground node 110.

As discussed previously, the emitters of M2 and M3 are connected together at node 111 and the emitters of M5 and M6 are connected together at node 121. The base terminals of M2 and M6 are connected to an oscillator and receive the LO signal 118. The oscillator may be located on the same chip as the mixer 120 or separate from the mixer 120 on a different chip. The base terminals of M3 and M5 are connected to each other and receive $\overline{LO}$ signal 116. $\overline{LO}$ represents the local oscillator signal and is reciprocal with respect to LO signal 118. The collectors of M2 and M5 are connected to resistor R1 at node 141. The collectors of M3 and M6 are connected to resistor R2 at node 131. Resistors R1 and R2 are connected to the supply voltage node 105 (VDD). The voltage of an intermediate frequency signal IF is output at VIF$^+$ and VIF$^-$. The intermediate frequency signal represents the mixed LO signal 118, $\overline{LO}$ signal 116, and RF input signal 115.

Figure 2:
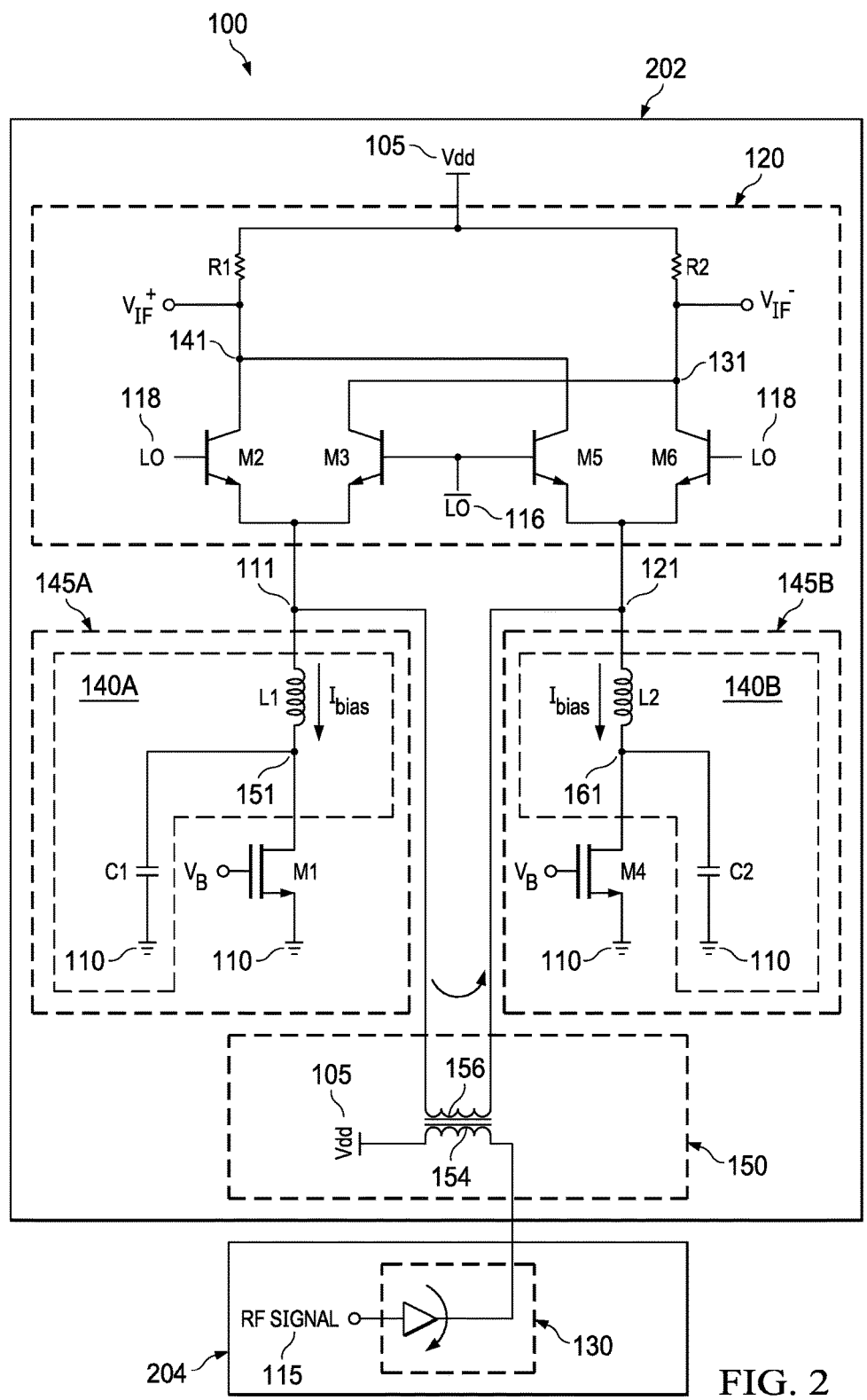
FIG. 2 illustrates an example configuration of an active mixer-based microwave down converter according to one embodiment.
Figure 3:
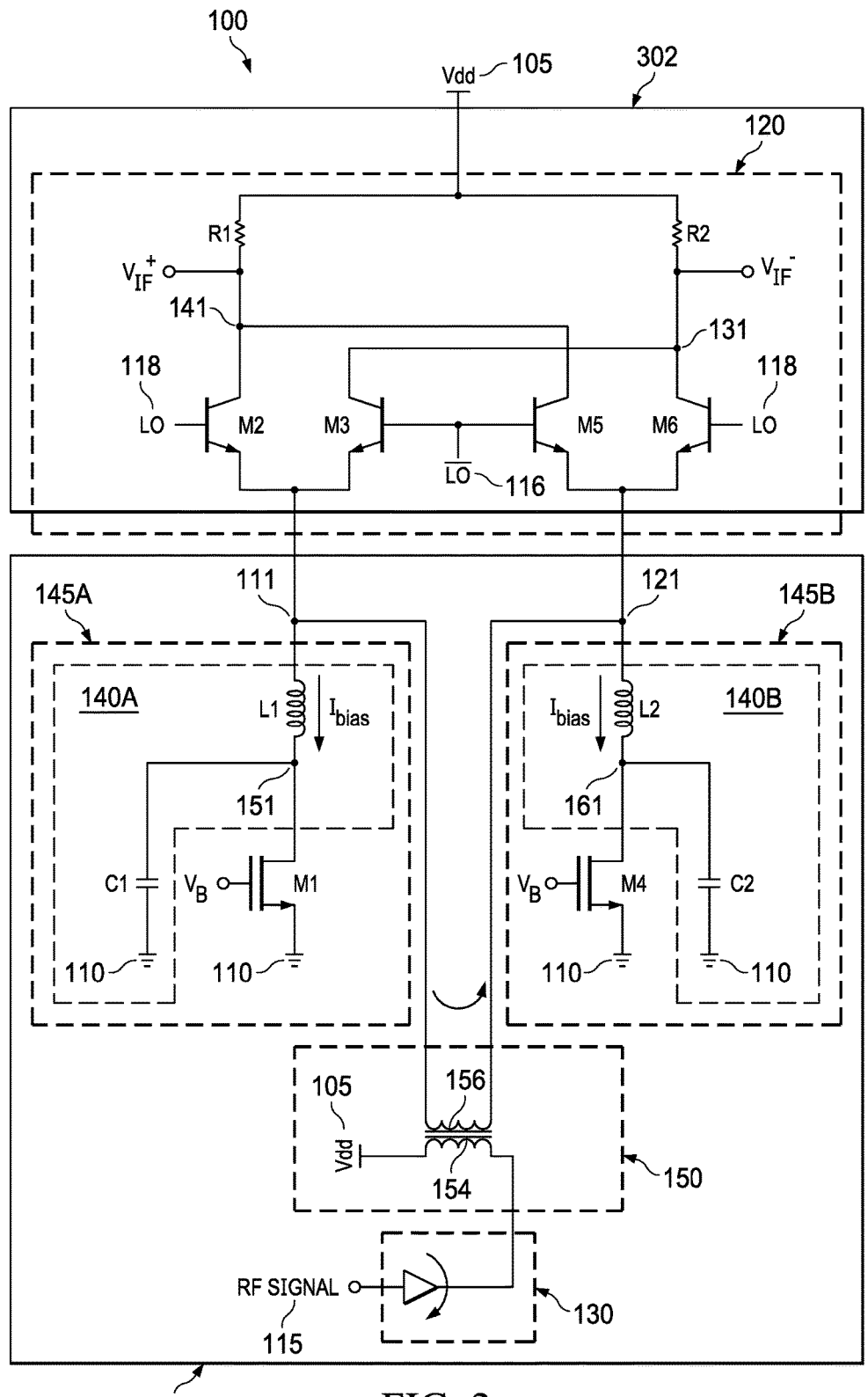
FIG. 3 illustrates an additional example configuration of an active mixer-based microwave down converter according to one embodiment.
Figure 4:
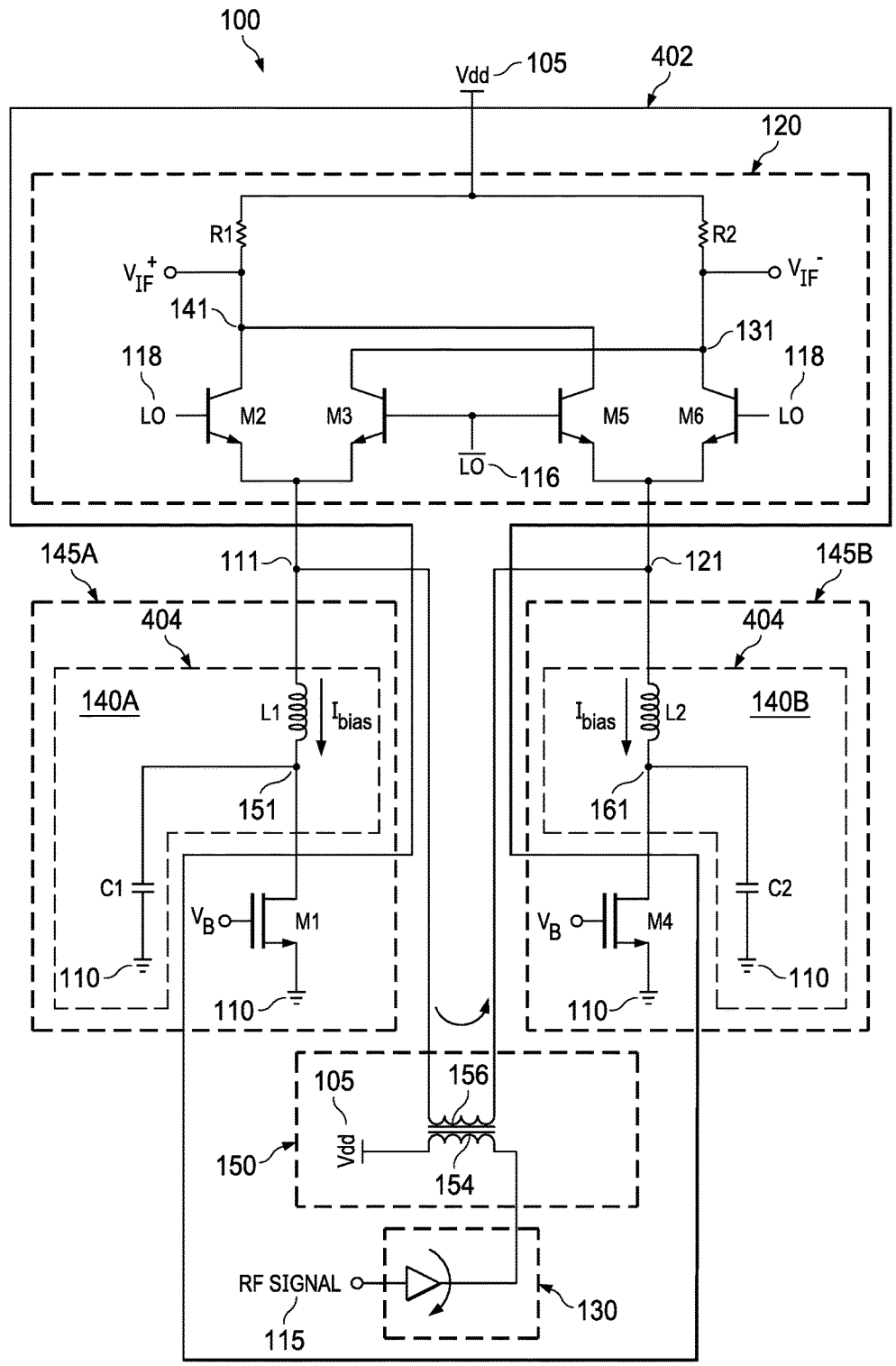
FIG. 4 illustrates a further example configuration of an active mixer-based microwave down converter according to one embodiment.
Figure 5:
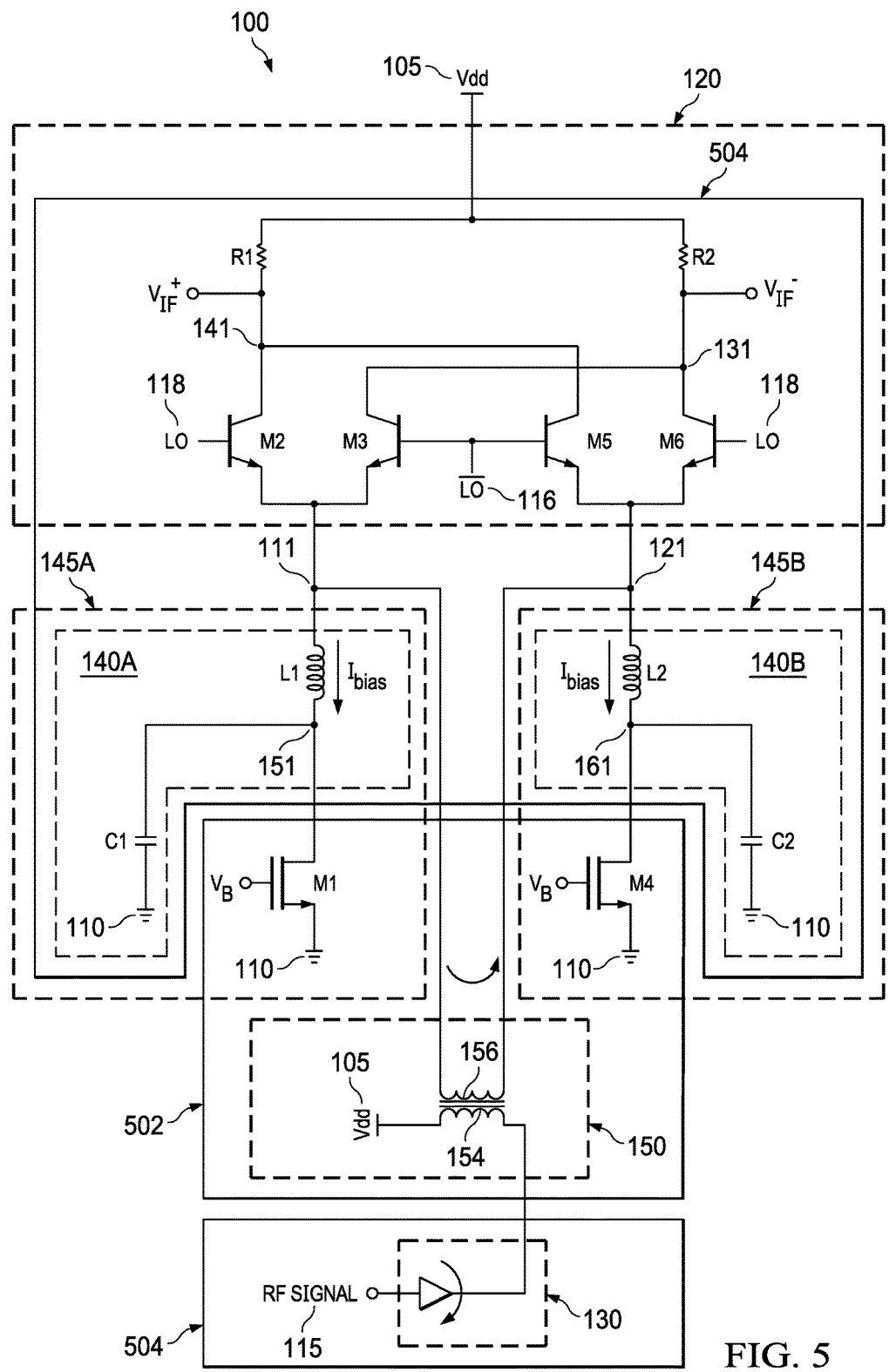
FIG. 5 illustrates another example configuration of an active mixer-based microwave down converter according to one embodiment.

In some examples, the down converter 100 is fabricated on a single semiconductor die ("chip"). FIG. 1, for example, illustrates that the mixer 120, LNA 130, transformer 150 and biasing circuits 145A and 145B are fabricated on a single semiconductor die 125. In other examples, as in FIGS. 2-5, the down converter 100 includes components provided on different semiconductor dies. In the example of FIG. 2, the mixer 120, biasing circuits 145A and 145B, and transformer 150 are placed on a common semiconductor die 202, while LNA 130 is provided on a separate semiconductor die 204. In the example of FIG. 3, the LNA 130, transformer 150, biasing circuits 145A and 145B are provided on die 304, while mixer 120 is provided on a separate die 302. In the example of FIG. 4, the LNA 130, transformer 150, mixer 120, and biasing transistors M1 and M4 are provided on a die 402, while filters 140A and 140B are provided on a different die 404. In the example of FIG. 5, the transformer coupling 150 and biasing transistors M1 and M4 are placed on a single semiconductor die 502 while LNA 130, filters 140A and 140B, and mixer 120 are provided on one or more separate die 504.

As discussed previously, the example down converter 100 provides for a relatively high dynamic range. For readability purposes, the dynamic range will be discussed with respect to the dynamic range inverse (DRI), $$\text{Dynamic range} = \frac{1}{DRI}.$$

The DRI may be represented by the equation $$DRI = \left(\frac{1}{XGM^2} + \frac{1}{XM^2}\right)(IGM^2 + IM^2),$$

where XGM represents the LNA 130's amplitude of the input-referred third-order intercept point referred to the LNA's input, XM represents the mixer 120's amplitude of the input-referred third-order intercept point referred to the mixer 120 input, IGM represents the LNA 130 input transistor's noise current, and IM represents the mixer 120's noise current referred to the mixer 120 input. The example down converter 100 provides a relatively high dynamic range due to reduced noise throughout the down converter, an increased input-referred third-order intercept point, and low current operation. Noise in the down converter is relatively low because LNA 130 operates at a lower current, mixer 120 operates at an improved current, transformer coupling 150 provides current gain, and the noise from tail current Itail is filtered by filters 140A and 140B. The input-referred third-order intercept point is higher because the number of active devices in the path of RF signal 115 is reduced, lowering intermodulation generation. As discussed previously with respect to noise, LNA 130 and mixer 120 operate at improved currents. This in turn allows example down converter 100 to operate at a lower current.

Certain terms have been used throughout this description and claims to refer to particular system components. As one skilled in the art will appreciate, different parties may refer to a component by different names. This document does not intend to distinguish between components that differ in name but not function. In this disclosure and claims, the terms "including" and "comprising" are used in an open-ended fashion, and thus should be interpreted to mean "including, but not limited to . . . ." Also, the term "couple"

or "couples" is intended to mean either an indirect or direct wired or wireless connection. Thus, if a first device couples to a second device, that connection may be through a direct connection or through an indirect connection via other devices and connections.

The above discussion is meant to be illustrative of the principles and various embodiments of the present invention. Numerous variations and modifications will become apparent to those skilled in the art once the above disclosure is fully appreciated. It is intended that the following claims be interpreted to embrace all such variations and modifications.

What is claimed is:

1. A down converter, comprising:
   a first biasing circuit comprising a first biasing transistor and a first node;
   a second biasing circuit comprising a second biasing transistor and a second node;
   a mixer comprising:
      a first resistor,
      a second resistor,
      a first transistor and a second transistor coupled together and to the first biasing circuit at the first node,
      a third transistor and a fourth transistor coupled together and to the second biasing circuit at the second node,
      wherein the second transistor and the fourth transistor are coupled together at a third node, the first transistor and the third transistor are coupled together at a fourth node, the first resistor is coupled to the fourth node and to a supply voltage node, and the second resistor is coupled to the third node and to the supply voltage node; and
   a transformer coupled to receive an amplifier output signal and coupled to the mixer, comprising a primary winding and a secondary winding, wherein the primary winding is coupled to receive the amplifier output signal and to a supply voltage and the secondary winding is coupled to the mixer and the first biasing circuit at the first node, and coupled to the mixer and the second biasing circuit at the second node.

2. The down converter of claim 1, wherein the first biasing circuit further comprises a first filter coupled to the first biasing transistor and the first node and the second biasing circuit further comprises a second filter coupled to the second biasing transistor and the second node.

3. The down converter of claim 2, wherein the first filter comprises a first inductor coupled to the first node and a first capacitor and the first capacitor further coupled to a ground node, and the second filter comprises a second inductor coupled to the second node and a second capacitor and the second capacitor further coupled to the ground node.

4. The down converter of claim 2, wherein the first filter and the second filter are located on a same semiconductor die as the mixer.

5. The down converter of claim 1, wherein a base terminal of the first transistor and a base terminal of the fourth transistor are coupled to receive a first signal from an oscillator and a base terminal of the second transistor and a base terminal of the third transistor are coupled to receive a second signal from the oscillator.

6. The down converter of claim 1, further comprising an oscillator to provide a first oscillator signal to base terminals of the first and fourth transistors and a second oscillator signal to base terminals of the second and third transistors, wherein the oscillator is on a same semiconductor die as the down converter.

7. The down converter of claim 1, wherein a voltage of an intermediate frequency signal is output at the third node and the fourth node.

8. A down converter, comprising:
   an amplifier coupled to receive a radio frequency input signal and to generate an amplified output signal;
   a first biasing circuit including a first biasing transistor and a first node configured to be coupled to a mixer;
   a second biasing circuit including a second biasing transistor and a second node configured to be coupled to the mixer; and
   a transformer comprising a primary winding and a secondary winding, wherein the primary winding is coupled to the amplifier and to a supply voltage node and a secondary winding is coupled to the first biasing circuit at the first node and to the second biasing circuit at the second node.

9. The down converter of claim 8, further comprising the mixer, the mixer comprising:
   a first resistor;
   a second resistor;
   a first transistor and a second transistor coupled to the first biasing circuit at the first node; and
   a third transistor and a fourth transistor coupled to the second biasing circuit at the second node; and
   wherein the second transistor and the fourth transistor are coupled together at a third node,
   the first transistor and the third transistor are coupled together at a fourth node,
   the first resistor is coupled to the fourth node and to a supply voltage node, and
   the second resistor is coupled to the third node and to the supply voltage node.

10. The down converter of claim 9, wherein a base terminal of the first transistor and a base terminal of the fourth transistor are coupled to receive a first signal from an oscillator and a base terminal of the second transistor and a base terminal of the third transistor are coupled to receive a second signal from the oscillator.

11. The down converter of claim 10, wherein the oscillator is located on a same semiconductor die as the transformer.

12. The down converter of claim 9, wherein a voltage of an intermediate frequency signal is output at the third node and the fourth node.

13. The down converter of claim 8, wherein the first biasing circuit further comprises a first filter coupled to the first biasing transistor and the first node and the second biasing circuit further comprises a second filter coupled to the second biasing transistor and the second node.

14. The down converter of claim 13, wherein the first filter comprises a first inductor coupled to the first node and a first capacitor and the first capacitor further coupled to a ground node, and the second filter comprises a second inductor coupled to the second node and a second capacitor and the second capacitor further coupled to the ground node.

15. The down converter of claim 13, wherein the first filter and the second filter are located on a same semiconductor die as the amplifier.

16. A down converter, comprising:
   an amplifier coupled to receive an input signal and generate an amplified output signal;
   a first biasing circuit including a first biasing transistor coupled to a first inductor;

a second biasing circuit including a second biasing transistor coupled to a second inductor;

a mixer including a first and second resistors and first, second, third, and fourth transistors, wherein the first and second transistors are coupled to the first inductor of the first biasing circuit at a first node, the third transistor and the fourth transistor are coupled to the second inductor of the second biasing circuit at a second node, the first resistor is coupled to the first and third transistors and to a supply voltage node, and the second resistor is coupled to the second and fourth transistors and to the supply voltage node; and a transformer comprising a primary winding and a secondary winding, wherein the primary winding is coupled to receive the amplified output signal and a secondary winding is coupled to the first node and to the second node to output the amplified output signal to the mixer.

17. The down converter of claim 16, wherein a base terminal of the first transistor and a base terminal of the fourth transistor are coupled to receive a first signal from an oscillator and a base terminal of the second transistor and a base terminal of the third transistor are coupled to receive a second signal from the oscillator.

18. The down converter of claim 17, wherein the oscillator is located on a same semiconductor die as the mixer.

19. The down converter of claim 17, wherein a third node interconnecting the first resistor to the first and third transistors provides an intermediate frequency signal referenced to a voltage on a fourth node interconnecting the second resistor to the second and fourth transistors.

20. The down converter of claim 16, wherein the first biasing circuit further comprises a first capacitor coupled to the first inductor and to a ground node, and the second biasing circuit further comprises a second capacitor coupled to the second inductor and to the ground node.

* * * * *